(12) United States Patent
Lee et al.

(10) Patent No.: US 12,131,918 B2
(45) Date of Patent: Oct. 29, 2024

(54) SUBSTRATE PROCESSING APPARATUS

(71) Applicant: SEMES CO., LTD., Cheonan-si (KR)

(72) Inventors: Sang Min Lee, Seoul (KR); Seung Hoon Oh, Cheonan-si (KR); Yong Joon Im, Yongin-si (KR); Hyo Won Yang, Seoul (KR)

(73) Assignee: SEMES CO., LTD., Cheonan-si (KR)

( * ) Notice: Subject to any disclaimer, the term of this patent is extended or adjusted under 35 U.S.C. 154(b) by 173 days.

(21) Appl. No.: 17/667,459

(22) Filed: Feb. 8, 2022

(65) Prior Publication Data

US 2022/0305536 A1  Sep. 29, 2022

(30) Foreign Application Priority Data

Mar. 29, 2021  (KR) .................. 10-2021-0040673

(51) Int. Cl.
 *H01L 21/67* (2006.01)
 *B08B 3/04* (2006.01)
 *F26B 5/00* (2006.01)

(52) U.S. Cl.
 CPC .. *H01L 21/67028* (2013.01); *H01L 21/67023* (2013.01); *B08B 3/04* (2013.01); *F26B 5/005* (2013.01); *H01L 21/6719* (2013.01)

(58) Field of Classification Search
 CPC ......... H01L 21/67023; H01L 21/67034; H01L 21/67028; H01L 21/6719
 See application file for complete search history.

(56) References Cited

U.S. PATENT DOCUMENTS

| 10,985,036 | B2 | 4/2021 | Kim et al. |
| 2012/0266925 | A1* | 10/2012 | Nakashima ......... H01L 21/6719 134/200 |
| 2018/0358242 | A1* | 12/2018 | Kim .................... H01L 21/6719 |
| 2019/0333759 | A1* | 10/2019 | Lee .................... H01L 21/67051 |
| 2021/0217635 | A1 | 7/2021 | Kim et al. |

FOREIGN PATENT DOCUMENTS

| JP | 2013-033815 | 2/2013 |
| JP | 2013-086622 | 5/2013 |
| JP | 2018-207103 | 12/2018 |
| JP | 2019-067863 | 4/2019 |
| KR | 10-2018-0134179 | 12/2018 |
| KR | 10-2019-0038330 | 4/2019 |

OTHER PUBLICATIONS

Machine translation of JP 2019067863A, dated Apr. 2019. (Year: 2019).*
Machine translation of JP 2013033815 A, dated Feb. 2013. (Year: 2013).*
Office Action from the Japan Patent Office dated Feb. 28, 2023.
Office Action from the Korean Intellectual Property Office dated Aug. 18, 2023.

* cited by examiner

*Primary Examiner* — Joseph L. Perrin
*Assistant Examiner* — Kevin G Lee

(57) ABSTRACT

A substrate processing apparatus includes a process chamber including a first body and a second body that are coupled to each other to form a processing space therein, a clamping member configured to clamp the first body and the second body, and an anti-friction member mounted in a groove formed in a contact region between the first body or the second body and the clamping member.

9 Claims, 21 Drawing Sheets

SUBSTRATE PROCESSING APPARATUS

CROSS REFERENCE TO RELATED APPLICATION

The present application claims priority to Korean Patent Application No. 10-2021-0040673, filed Mar. 29, 2021, the entire contents of which is incorporated herein for all purposes by this reference.

BACKGROUND OF THE INVENTION

Field of the Invention

The present disclosure relates to a substrate processing apparatus and, more particularly, to a substrate processing apparatus for preventing damage caused by friction between parts in a semiconductor manufacturing facility that processes a substrate in a high-temperature and high-pressure environment.

Description of the Related Art

A semiconductor (or display) manufacturing process is a process for the manufacture of a semiconductor device on a substrate (e.g., a wafer). The process includes, for example, exposure, deposition, etching, ion implantation, cleaning, and the like. In particular, various organic and inorganic foreign substances are present on the substrate. It is thus very important to effectively remove foreign substances on the substrate in order to improve manufacturing yield.

To remove such foreign substances, a cleaning process using a treatment liquid (cleaning liquid) is mainly used. The cleaning process may be performed by supplying the treatment liquid to an upper or rear surface of the substrate while rotating a spin chuck supporting the substrate. After the cleaning process, a rinsing process using a rinse liquid and a drying process using a drying gas are performed.

The drying process is a process for the drying of the rinse liquid remaining on the substrate. The rinse liquid on the substrate is replaced with an organic solvent having a lower surface tension than the rinse liquid, such as isopropyl alcohol (IPA), after which the organic solvent is removed. However, as the distance between patterns formed on the substrate becomes smaller, a pattern leaning phenomenon occurs in which the patterns are brought into contact with each other due to the organic solvent remaining in the space between the patterns.

In an effort to solve such a problem, a process of removing an organic solvent remaining on a substrate using a supercritical fluid has been proposed. The process using the supercritical fluid is performed in an environment of high temperature and high pressure. Therefore, a substrate processing apparatus for processing a substrate by implementing such a high-temperature and high-pressure environment has been proposed. When a structure in which two bodies are coupled to each other is adopted to implement the high-temperature and high-pressure environment, damage and particle generation may occur due to friction between parts.

The foregoing is intended merely to aid in the understanding of the background of the present disclosure, and is not intended to mean that the present disclosure falls within the purview of the related art that is already known to those skilled in the art.

SUMMARY OF THE INVENTION

Accordingly, the present disclosure has been made keeping in mind the above problems occurring in the related art, and an objective of the present disclosure is to provide a substrate processing apparatus capable of reducing damage and particle generation caused by an impact generated upon contact between parts.

The objectives of the present disclosure are not limited to the above-mentioned objective, and other objectives not mentioned will be clearly understood by those skilled in the art from the following description.

According to an embodiment, there is provided a substrate processing apparatus including: a process chamber comprising a first body and a second body that are coupled with each other, and a processing space defined by the first body and the second body coupled with each other; a clamping member configured to clamp the first body and the second body; and an anti-friction member mounted in a groove formed at a contact region between the clamping member and at least one of the first body and the second body.

According to an embodiment of the present invention, there is provided a substrate processing apparatus including: a first body having a chamber shape defining a processing space for a substrate and an opening formed at a side of the chamber shape; a second body having a shape corresponding to the opening and fitted into the opening to close the processing space for the substrate; a locking member configured to fix the second body and the first body with each other; and an anti-friction member mounted in a groove formed at a contact region between the second body and the locking member.

According to an embodiment of the present invention, there is provided a substrate processing facility including: a substrate loading unit configured to allow a substrate to be input and discharged therethrough; a substrate transfer unit configured to transfer the substrate; a first process processing unit configured to primarily supply a cleaning liquid for removing foreign substances remaining on the substrate to the substrate, secondarily supply a rinse liquid for removing the cleaning liquid to the substrate, and tertiarily supply an organic solvent for drying the rinse liquid to the substrate; and a second process processing unit configured to dry the organic solvent remaining on the substrate. The second process processing unit may include: a process chamber comprising a first body and a second body that are coupled to each other to form a processing space therein; a fluid supplier configured to supply a fluid to the processing space; a temperature controller configured to control temperature of the processing space; a clamping member configured to clamp the first body and the second body; and an anti-friction member mounted in a groove formed in a contact region between the first and second bodies and the clamping member. Here, a side wall of the groove and a side surface of the anti-friction member are not in contact with each other.

According to the substrate processing apparatus according to the embodiment of the present disclosure, by the provision of the anti-friction member mounted in the groove formed in the contact region between the first and second bodies and the clamping member (or locking member), it is possible to reduce damage and particle generation caused by an impact generated upon contact therebetween.

The effects of the present disclosure are not limited to the above-mentioned effect, and other effects not mentioned will be clearly understood by those skilled in the art from the following description.

BRIEF DESCRIPTION OF THE DRAWINGS

The above and other objectives, features, and other advantages of the present disclosure will be more clearly understood from the following detailed description when taken in conjunction with the accompanying drawings, in which.

DETAILED DESCRIPTION OF THE INVENTION

Figure 1:
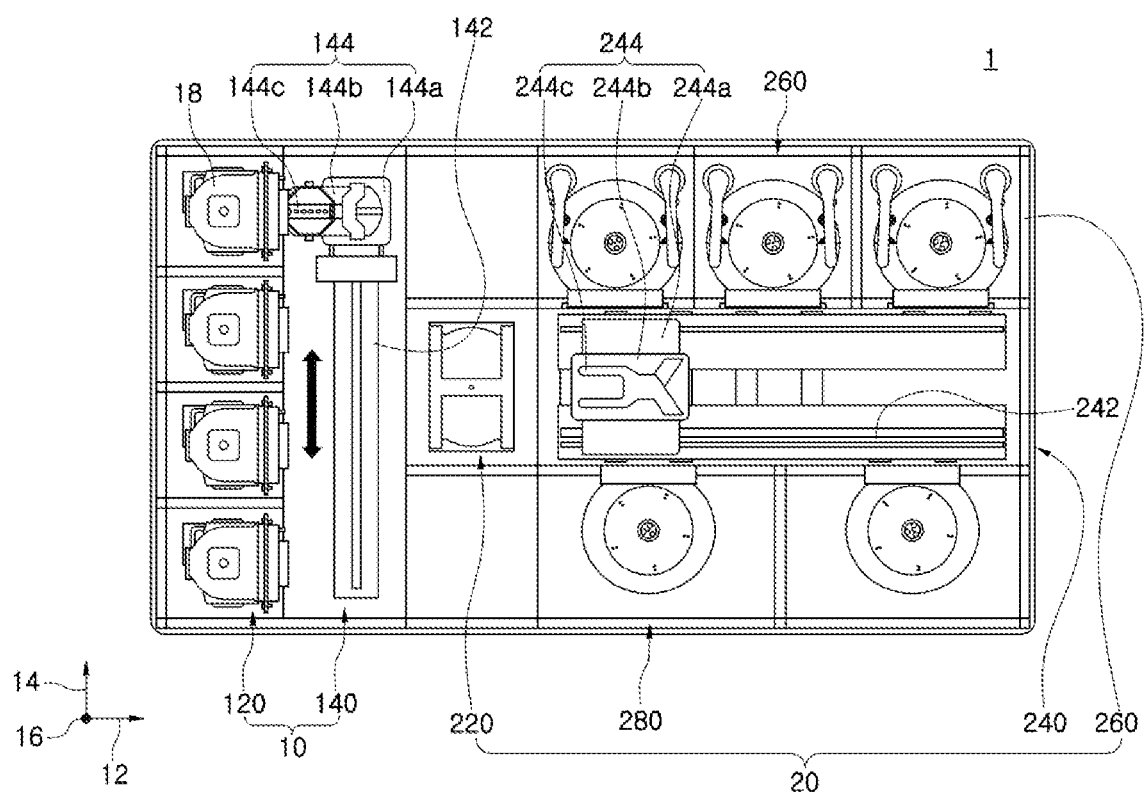
FIG. 1 is a view illustrating a schematic structure of a substrate processing facility.

Hereinafter, exemplary embodiments of the present disclosure will be described in detail with reference to the accompanying drawings such that the present disclosure can be easily embodied by one of ordinary skill in the art to which this disclosure belongs. The present disclosure may, however, be embodied in many different forms and should not be construed as being limited to only the embodiments set forth herein.

For clarity, a description of parts not related to describing the present disclosure is omitted here, and the same reference numerals are allocated to the same or similar components throughout the disclosure.

Components having the same structure in various embodiments will be allocated the same reference numeral and explained only in a representative embodiment, and components which are different from those of the representative example will be described in the other embodiments.

As used herein, when an element is referred to as being "connected to (or coupled to)" another element, the element can be directly connected to (or coupled to) the other element or be indirectly connected to (or coupled to) the other element having an intervening element therebetween. It will be further understood that the terms "comprises", "comprising", "includes", and/or "including", when used herein, specify the presence of stated elements but do not preclude the presence or addition of one or more other elements unless mentioned otherwise.

Unless otherwise defined, all terms including technical and scientific terms used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

FIG. 1 illustrates a schematic structure of a substrate processing facility 1. The substrate processing facility 1 includes an index part 10 and a process processing part 20.

The index part 10 includes a load port 120 and an index chamber 140. As illustrated in FIG. 1, the load port 120, the index chamber 140, and the process processing part 20 may be sequentially arranged. Hereinafter, a direction in which the load port 120, the index chamber 140, and the process processing part 20 are arranged is referred to as a first direction 12. In addition, when viewed from the top, a direction perpendicular to the first direction 12 is referred to as a second direction 14, and a direction perpendicular to a plane including the first direction 12 and the second direction 14 is referred to as a third direction 16.

On the load port 120, a carrier 18 in which a substrate W is accommodated is placed. A plurality of load ports 120 are provided and may be aligned along the second direction 14. In FIG. 1, four load ports 120 are illustrated. However, the number of load ports 120 may be increased or decreased depending on conditions such as process efficiency of the process processing part 20, footprints, and the like. As the carrier 18, a front opening unified pod (FOUP) may be used.

The index chamber 140 is positioned between the load port 120 and the process processing part 20. The index chamber 140 has a rectangular parallelepiped shape including a front panel, a rear panel, and side panels. In the index chamber 140, an index robot 144 for transferring the substrate W between the carrier 18 placed on the load port 120 and a load lock chamber 220 is provided. Although not illustrated in the drawings, the index chamber 140 may include a controlled air flow system such as vents and a laminar flow system to prevent particles from being introduced into an internal space thereof.

An index rail 142 is disposed such that a longitudinal direction thereof is parallel to the second direction 14. The index robot 144 is installed on the index rail 142 and is moved linearly on the index rail 142 along the second direction 14. The index robot 144 has a base 144a, a robot body 144b, and an index arm 144c. The base 144a is movable along the index rail 142. The robot body 144b is coupled to the base 144a. The robot body 144b is movable on the base 144a along the third direction 16. In addition, the robot body 144b is rotatable on the base 144a. The index arm 144c is coupled to the robot body 144b and is movable forward and rearward relative to the robot body 144b. A plurality of index arms 144c are provided and are individually driven. The index arms 144c are arranged to be stacked on top of each other along the third direction 16 while being spaced apart from each other. A part of the index arms 144c may be used when transferring the substrate W from the process processing part 20 to the carrier 18, and the remaining part of the index arms 144c may be used to transfer the substrate W from the carrier 18 to the process processing part 20. This prevents particles, which are generated from the substrate W before process processing during loading and unloading of the substrate W by the index robot 144, from adhering to the substrate W after process processing.

The process processing part 20 may include the load lock chamber 220, a transfer chamber 240, a first process processing unit 260, and a second process processing unit 280. The transfer chamber 240 may be disposed such that a longitudinal direction thereof is parallel to the first direction 12. The first process processing unit 260 may be disposed on a first side of the transfer chamber 240 in the second direction 14, and the second process processing unit 280 may be disposed on a second side of the transfer chamber 240 in the second direction 14. The first process processing unit 260 and the second process processing unit 280 may be stacked on top of each other The load lock chamber 220 is disposed between the index chamber 140 and the transfer chamber 240. The load lock chamber 220 provides a space for temporarily loading the substrate W before the substrate W is transferred between the transfer chamber 240 and the index chamber 140. The load lock chamber 220 is provided with a slot (not illustrated) in which the substrate W is placed. A plurality of slots (not illustrated) are provided and are arranged to be spaced apart from each other along the third direction 16. The load lock chamber 220 may be configured such that a surface thereof facing the index chamber 140 and a surface thereof facing the transfer chamber 240 are open. The index chamber 140, the load lock chamber 220, and a main robot 244 may be collectively referred to as a substrate transfer unit.

The transfer chamber 240 may transfer the substrate W between the load lock chamber 220, the first process processing unit 260, and the second process processing unit 280. A guide rail 242 and the main robot 244 may be provided in the transfer chamber 240. The guide rail 242 is disposed such that a longitudinal direction thereof is parallel to the first direction 12. The main robot 244 is installed on the guide rail 242 and is moved linearly on the guide rail 242 along the first direction 12.

Hereinafter, components for transferring the substrate W are defined as a transfer unit. For example, the transfer unit may include the transfer chamber 240 and the index chamber 140. In addition, the transfer unit may include the main robot 244 provided in the transfer chamber 240 and the index robot 144.

The first process processing unit 260 and the second process processing unit 280 may sequentially perform processes on one substrate W. For example, the substrate W may be subjected to a chemical process, a rinse process, and a primary drying process in the first process processing unit 260, and may be subjected to a secondary drying process in the second process processing unit 280. In this case, the primary drying process may be performed using an organic solvent, and the secondary drying process may be performed using a supercritical fluid. An isopropyl alcohol (IPA) liquid may be used as the organic solvent, and carbon dioxide ($CO_2$) may be used as the supercritical fluid. On the other hand, the primary drying process in the first process processing unit 260 may be omitted.

That is, the first process processing unit 260 may primarily supply a cleaning liquid for removing foreign substances remaining on the substrate W to the substrate W, then secondarily supply a rinse liquid (e.g., pure water) for removing the cleaning liquid to the substrate W, and then tertiarily supply an organic solvent for drying the rinse liquid to the substrate W. Thereafter, the substrate W is transferred to the second process processing unit 280 by the transfer unit. The second process processing unit 280 supplies a fluid for drying the organic solvent remaining on the substrate W, and maintains the fluid in a supercritical state by creating a high-temperature and high-pressure environment in a processing space. That is, the second process processing unit 280 prevents process defects such as pattern leaning by drying the organic solvent remaining on the substrate W in a supercritical state.

According to an embodiment, isopropyl alcohol (IPA) may be used as the organic solvent, and carbon dioxide ($CO_2$) may be used as the fluid. The second process processing unit 280 may dry isopropyl alcohol on the substrate W by maintaining carbon dioxide in a supercritical state.

Hereinafter, an embodiment of a substrate processing apparatus provided as a part of the second process processing unit 280 will be described. The second process processing unit 280 is provided with a substrate processing apparatus 400 in which the secondary drying process is performed on the substrate W. The substrate processing apparatus 400 dries the substrate W on which the organic solvent remains. The substrate processing apparatus 400 may dry the substrate W using a supercritical fluid.

FIGS. 2 to 6 illustrate the substrate processing apparatus 400 for drying a rinse liquid on the substrate W using the supercritical fluid and an example of an operating sequence of the substrate processing apparatus 400. Referring to FIGS. 2 to 6, the substrate processing apparatus 400 includes a housing 402, a process chamber 410, a substrate support unit 440, a lifting member 450, a heating member 460, a blocking member 480, an exhaust unit 470, a fluid supply unit 490, a clamping member 500, a moving member 550, and a controller (not illustrated).

The housing 402 includes a frame 404 and an intermediate plate 406. The frame 404 has a cylindrical shape having a space therein. For example, the frame 404 may have a rectangular parallelepiped shape. Through-holes 405 for allowing a fluid to flow therethrough are famed in an upper surface of the frame 404.

The intermediate plate 406 is positioned within the frame 404. The intermediate plate 406 divides the inside of the frame 404 into an upper space 408a and a lower space 408b. The intermediate plate 406 may have a plate shape having a hollow opening. The process chamber 410 and the clamping member 500 may be positioned in the upper space 408a, and the lifting member 450 may be positioned in the lower space 408b. The moving member 550 may be positioned on the housing 402.

The process chamber 410 has a processing space 412 therein for processing the substrate W. The process chamber 410 closes the processing space 412 from the outside while the substrate W is processed. The process chamber 410 includes a second body 420, a first body 430, and a sealing member 414.

For example, the second body 420 may have a substantially cylindrical shape. The second body 420 is movable by the lifting member 450 into the upper space 408a and the lower space 408b of the frame 404. A lower supply port 422 and an exhaust port 426 are formed in a lower surface of the second body 420. The lower supply port 422 functions as a flow channel for allowing the supercritical fluid to be supplied to the processing space 412 therethrough.

The first body 430 and the second body 420 are coupled to each other to form the processing space 412 therein. The first body 430 is positioned above the second body 420. The first body 430 is positioned in the upper space 408a of the housing 402. The first body 430 is coupled to a ceiling surface of the frame 404 by a buffer member 435. The first body 430 has stepped side end portions. The first body 430 has a shape in which a central portion of an upper surface is positioned higher than an edge portion thereof. For example, the first body 430 may have a substantially cylindrical shape. An upper supply port 432 is formed in the first body 430. The upper supply port 432 functions as a flow channel for allowing the supercritical fluid to be supplied to the processing space 412 therethrough. According to an example, each of the first body 430 and the second body 420 may be made of metal. The upper supply port 432 and the lower supply port 422 may be collectively referred to as a fluid supplier.

According to the embodiment of the present disclosure, an anti-friction member 730 may be mounted in a groove formed in a contact region between the first and second bodies 430 and 420 and the clamping member 500. FIGS. 2 to 6 illustrate a case where the anti-friction member 730 is mounted on each of the first body 430 and the second body 420. On the other hand, the anti-friction member 730 may be mounted on the clamping member 500.

The sealing member 414 seals a gap between the first body 430 and the second body 420. The sealing member 414 is positioned between the first body 430 and the second body 420. The sealing member 414 has an annular ring shape. The sealing member 414 may be configured, for example, as an O-ring. The sealing member 414 is provided on a lower surface of the first body 430 or an upper surface of the second body 420. In some embodiments, the sealing member 414 is described as being provided on the upper surface of the second body 420. A sealing groove into which the sealing member 414 is inserted is formed in the upper surface of the second body 420. A part of the sealing member 414 is inserted into the sealing groove, and the remaining part thereof protrudes from the sealing groove. The sealing member 414 may be made of an elastic material.

The substrate support unit 440 supports the substrate W in the processing space 412. The substrate support unit 440 supports the substrate W such that a processing surface of the substrate W faces upward.

The lifting member 450 controls a relative position between the first body 430 and the second body 420. The lifting member 450 lifts and lowers one of the first body 430 and the second body 420 so as to approach or move away from the remaining one thereof. The lifting member 450 lifts and lowers one of the first body 430 and the second body 420 so that the process chamber 410 is moved to an open position or a closed position. Here, the open position is a position where the first body 430 and the second body 420 are spaced apart from each other, and the closed position is a position where the first body 430 and the second body 420 are in close contact with each other. That is, in the open position, the processing space 412 is opened to the outside, and in the closed position, the processing space 412 is closed from the outside.

In some embodiments, it is described that the lifting member 450 lifts and lowers the second body 420 in the lower space 408b, and the position of the first body 430 is fixed. Optionally, the position of the second body 420 may be fixed, and the first body 430 may be lifted and lowered relative to the second body 420. In this case, the lifting member 450 may be positioned in the upper space 408a.

The lifting member 450 includes a support plate 452, a lifting shaft 454, and an actuator 456. The support plate 452 supports the second body 420 in the lower space 408b. The second body 420 is fixedly coupled to the support plate 452. The support plate 452 has a circular plate shape. The support plate 452 has a larger diameter than the hollow opening. Therefore, a lower end of the second body 420 is still positioned in the lower space 408b in the closed position. The lifting shaft 454 supports a lower surface of the support plate 452 in the lower space 408b. The lifting shaft 454 is fixedly coupled to the support plate 452. A plurality of lifting shafts 454 may be provided. The lifting shafts 454 may be arranged along a circumferential direction. The actuator 456 lifts and lowers each of the lifting shafts 454. A plurality of actuators 456 are provided. Each of the actuators 456 is coupled to a corresponding one of the lifting shafts 454. When a driving force is supplied to each of the actuators 456, as the second body 420 and the lifting shafts 454 are lifted, the first body 430 and the second body 420 are moved to the closed position where the processing space 412 is closed from the outside. When the driving force of each of the actuators 456 is released in the closed position, the first body 430 and the second body 420 may maintain the closed position. The driving force is equally supplied to each of the actuators 456, and the driving force of each of the actuators 456 is equally released. Therefore, the plurality of lifting shafts 454 are positioned at the same height during lifting and lowering, and the support plate 452 and the second body 420 may be lifted and lowered while maintaining horizontal alignment. Each of the actuators 456 may be, for example, a cylinder or a motor.

Optionally, when the driving force of each of the actuators 456 is released in the closed position, as the second body 420 and the lifting shafts 454 are lowered, the first body 430 and the second body 420 are moved to the open position where the processing space 412 is opened to the outside.

The heating member 460 heats the processing space 412. The heating member 460 heats the supercritical fluid supplied to the processing space 412 to equal to or larger than a critical temperature, thereby maintaining a supercritical fluid state. The heating member 460 may include a plurality of heaters. The heating member 460 may be referred to as a temperature controller.

Each heating member 460 has a longitudinal bar or rod shape, and respective heating members 460 have longitudinal directions parallel to each other. The heating member 460 has a longitudinal direction perpendicular to moving directions of first and second clamps 510 and 520. For example, the heating member 460 may have a longitudinal direction parallel to a moving direction of each of the second and first bodies 420 and 430. This is because, since side portions of each of the second and first bodies 420 and 430 are clamped, it is impossible to insert the heating member 460 from side surfaces of each of the second and first bodies 420 and 430. The heating member 460 may be buried in a wall of at least one of the first body 430 and the second body 420. For example, the heaters may generate heat by receiving power from an external source. Although it has been described in this embodiment that the heating member 460 is provided in the first body 430, the heating member 460 may be provided in each of the first body 430 and the second body 420. On the other hand, the heating member 460 may not be provided in the first body 430 but may be provided in the second body 420.

The blocking member 480 includes a blocking plate 482 and a support 484. The blocking plate 482 is positioned between the lower supply port 422 and the substrate support unit 440. The blocking plate 482 has a circular plate shape. The blocking plate 482 has a smaller diameter than the inner diameter of the second body 420. When viewed from the top, the blocking plate 482 has a diameter that covers both the lower supply port 422 and the exhaust port 426. For example, the blocking plate 482 may have a diameter equal to or larger than that of the substrate W. The support 484 supports the blocking plate 482. A plurality of supports 484 are provided and are arranged along a circumferential direction of the blocking plate 482. The supports 484 are arranged to be spaced apart from each other at regular intervals.

The exhaust unit 470 exhausts a fluid in the processing space 412. Process by-products generated in the processing space 412 are exhausted through the exhaust unit 470. The process by-products may be exhausted naturally or forcedly.

In addition, the exhaust unit 470 controls the pressure of the processing space 412 while exhausting the process by-products. The exhaust unit 470 includes an exhaust line 472 and a pressure measuring member 474. The exhaust line 472 is connected to the exhaust port 426. An exhaust valve 476 is installed in the exhaust line 472 and controls the amount of exhaust in the processing space 412. The pressure measuring member 474 is installed in the exhaust line 472 and measures the pressure of the exhaust line 472. The pressure measuring member 474 is positioned upstream of the exhaust valve 476 in an exhaust direction. By the exhaust unit 470, the processing space 412 is reduced to a normal pressure or a pressure equal to the pressure outside of the process chamber 410.

The fluid supply unit 490 supplies a processing fluid to the processing space 412. The processing fluid is supplied in a supercritical state by a critical temperature and a critical pressure. The fluid supply unit 490 includes an upper supply line 492 and a lower supply line 494. The upper supply line 492 is connected to the upper supply port 432. The processing fluid is supplied to the processing space 412 sequentially through the upper supply line 492 and the upper supply port 432. An upper valve 493 is installed in the upper supply line 492. The upper valve 493 opens and closes the upper supply line 492. The lower supply line 494 connects the upper supply line 492 and the lower supply port 422 to each other. The lower supply line 494 is branched from the upper supply line 492 and connected to the lower supply port 422. That is, the same type of processing fluid may be supplied from each of the upper supply line 492 and the lower supply line 494. The processing fluid is supplied to the processing space 412 sequentially through the lower supply line 494 and the lower supply port 422. A lower valve 495 is installed in the lower supply line 494. The lower valve 495 opens and closes the lower supply line 494.

According to an example, the processing fluid may be supplied from the lower supply port 422 facing a non-processing surface of the substrate W, after which the processing fluid may be supplied from the upper supply port 432 facing the processing surface of the substrate W. Therefore, the processing fluid may be supplied to the processing space 412 through the lower supply line 494, and then may be supplied to the processing space 412 through the upper supply line 492. This is to prevent the initially supplied processing fluid from being supplied to the substrate W in a state where the critical pressure or the critical temperature has not been reached.

The clamping member 500 clamps the first body 430 and the second body 420 positioned in the closed position. Therefore, even when the pressure in the processing space 412 increases during processes, it is possible to prevent a gap from being generated between the first body 430 and the second body 420. In addition, the driving force of each of the actuators 456 is released while the process chamber 410 is clamped by the clamping member 500. This prevents the actuators 456 from being damaged by a strong force acting on the actuators 456 for a long period of time.

The clamping member 500 includes the first clamp 510 and the second clamp 520. The first clamp 510 and the second clamp 520 are positioned at lateral sides of the process chamber 410. According to an example, the first clamp 510 and the second clamp 520 may be positioned to face each other with the process chamber 410 interposed therebetween. Each of the first clamp 510 and the second clamp 520 has a shape surrounding the process chamber 410. Each of the first clamp 510 and the second clamp 520 has a clamp groove formed in an inner surface thereof facing the process chamber 410. Edge portions of the first body 430 and edge portions of the second body 420 positioned in the closed position are inserted into the respective clamp grooves. The clamping member 500 is movable to a locking position or a release position. Here, the locking position is a position where the first clamp 510 and the second clamp 520 are close to each other to clamp the first body 430 and the second body 420, and the release position is a position where the first clamp 510 and the second clamp 520 are spaced apart from the first body 430 and the second body 420. The first clamp 510 and the second clamp 520 are coupled to each other in the locking position to have an annular ring shape. For example, a vertical section of any one of the first clamp 510 and the second clamp 520 may have a "C" or "U" shape, and a vertical section of the remaining one thereof may be symmetrical with the vertical section of any one thereof with respect to a vertical axis.

The moving member 550 moves the clamping member 500 to the locking position and release position. The moving member 550 moves the clamping member 500 in a direction perpendicular to a moving direction of the process chamber 410. The moving member 550 includes a guide rail 560, a bracket 570, and an actuating member 580. The guide rail 560 is positioned on the outside of the housing 402. The guide rail 560 is positioned adjacent to the upper space 408a in which the first body 430 is positioned. The guide rail 560 is installed on an upper surface of the housing 402. The guide rail 560 has a longitudinal direction perpendicular to the moving direction of the process chamber 410. A plurality of guide rails 560 are provided and have the same longitudinal direction. According to an example, the guide rails 560 may be provided in the same number as the through-holes 405. The guide rails 560 have a longitudinal direction parallel to the through-holes 405. When viewed from the top, the guide rails 560 are positioned to overlap the through-holes 405. The bracket 570 fixedly couples the guide rails 560 and the clamping member 500 to each other. The bracket 570 is provided in the same number as the guide rails 560. According to an example, the first clamp 510 may be connected to a guide rail 560 positioned on one side when viewed from the top, and the second clamp 520 may be connected to a guide rail positioned on the other side. The actuating member 580 drives the guide rails 560 so that the clamping member 500 is moved to the locking position or the release position along the longitudinal direction of the guide rails 560.

The controller controls the lifting member 450 and the moving member 550. The controller controls the lifting member 450 to cause the process chamber 410 to be moved to the closed position or the open position, and controls the moving member 550 to cause the clamping member 500 to be moved to the locking position or the release position. According to an example, when the process chamber 410 is moved from the open position to the closed position by the controller, the clamping member 500 may be moved from the release position to the locking position. When the process chamber 410 is closed by the clamping member 500, the controller may control the lifting member 450 to release the driving force of each of the actuators 456.

Figure 2:
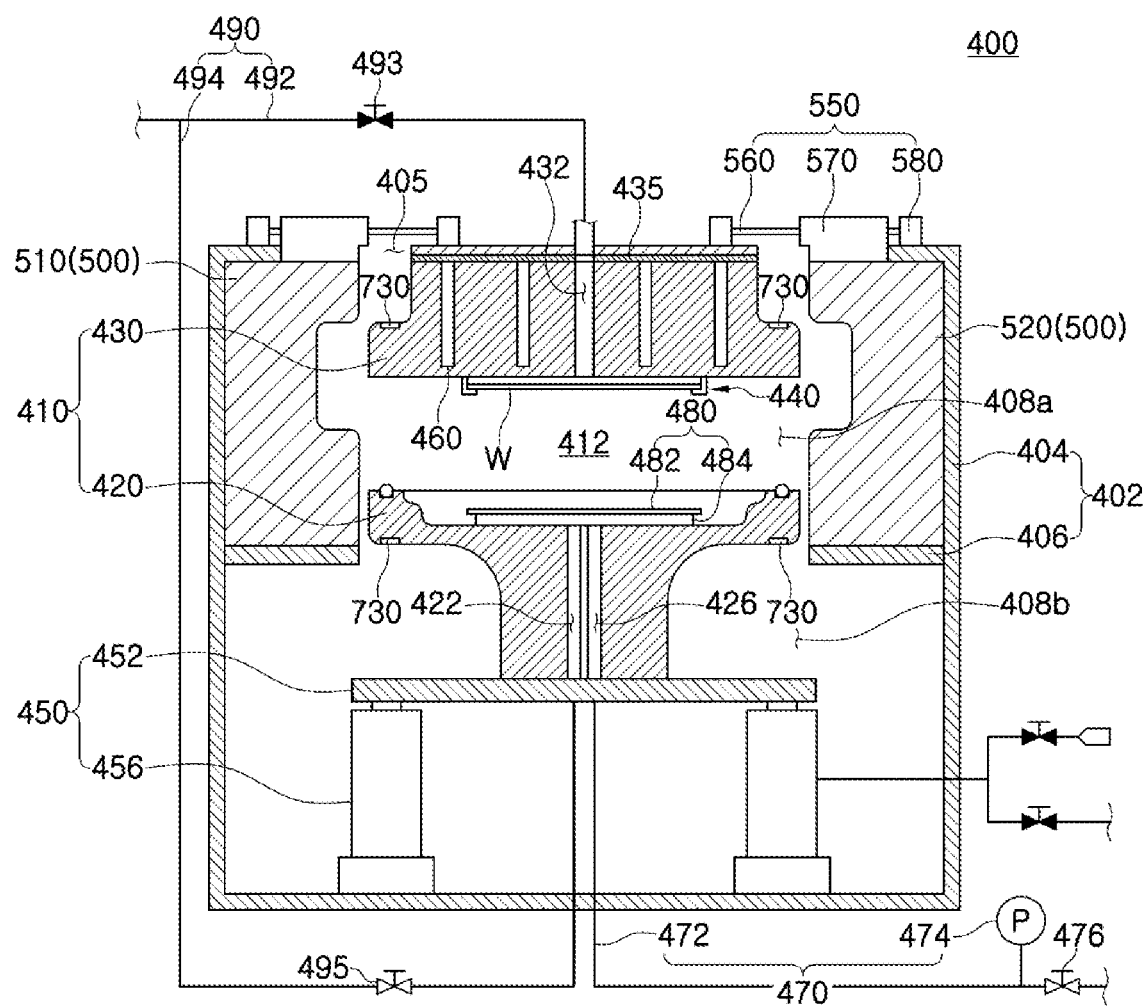
FIGS. 2 to 6 illustrate the substrate processing apparatus for drying a rinse liquid on the substrate using the supercritical fluid and an example of an operating sequence of the substrate processing apparatus.
Figure 3:
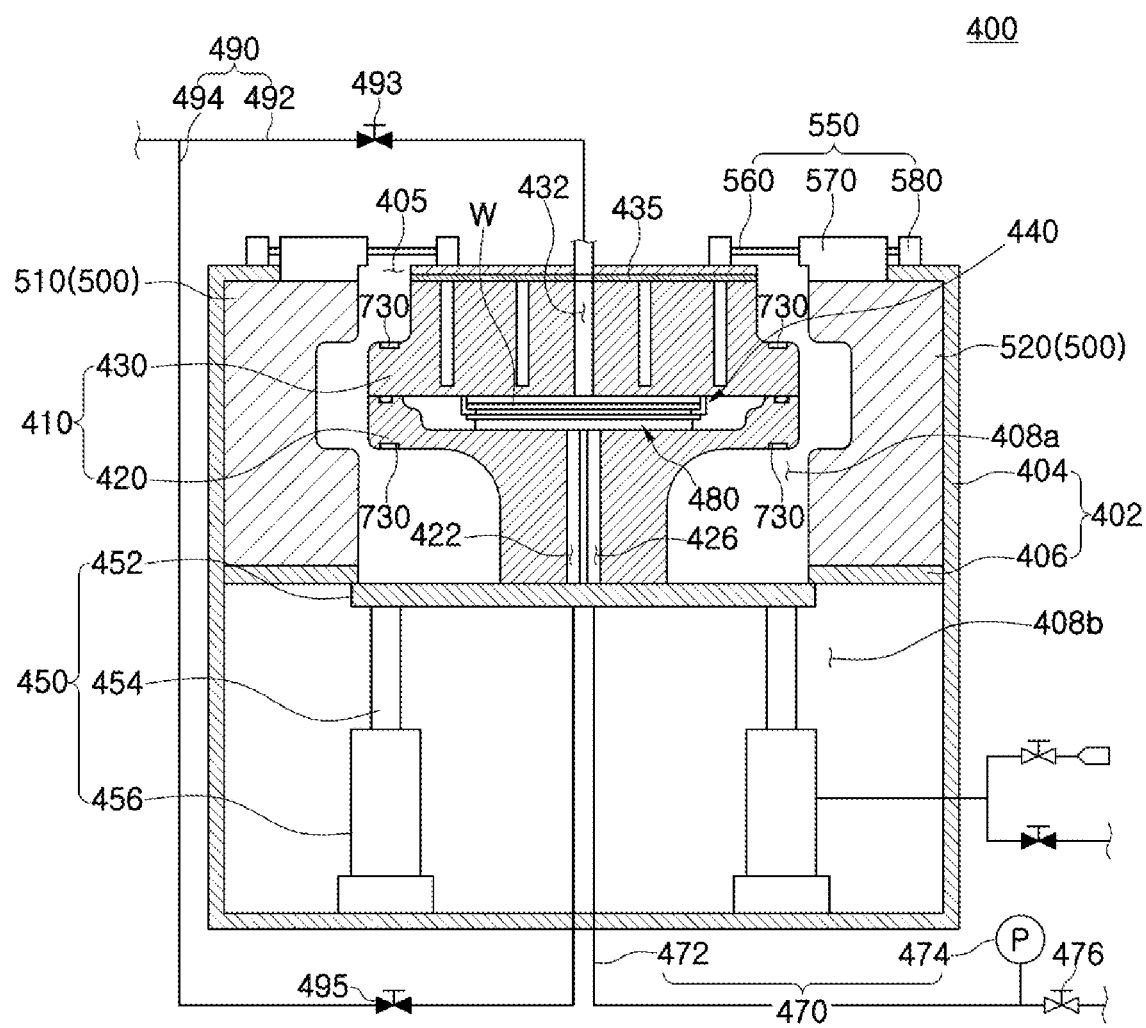
Figure 4:
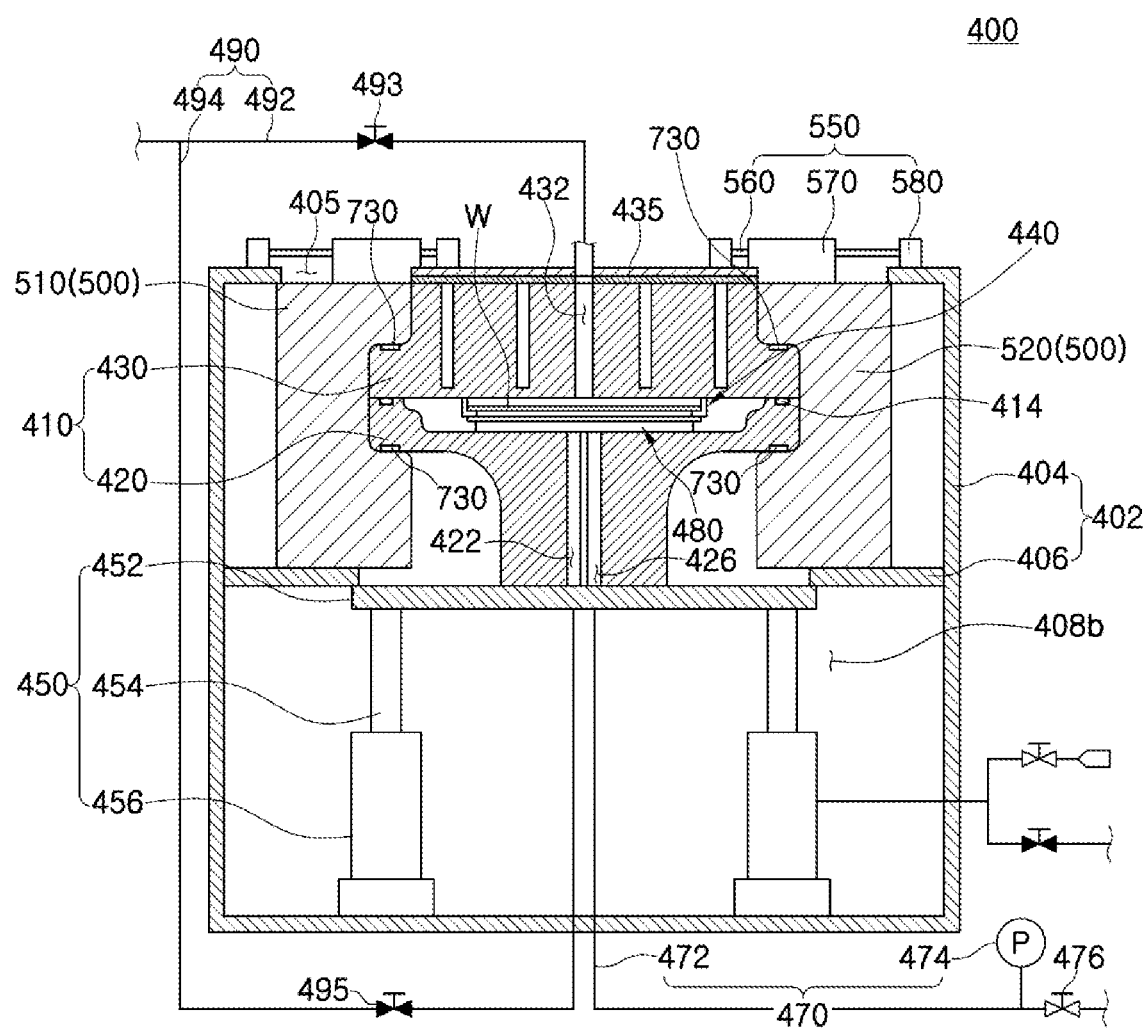
Figure 5:
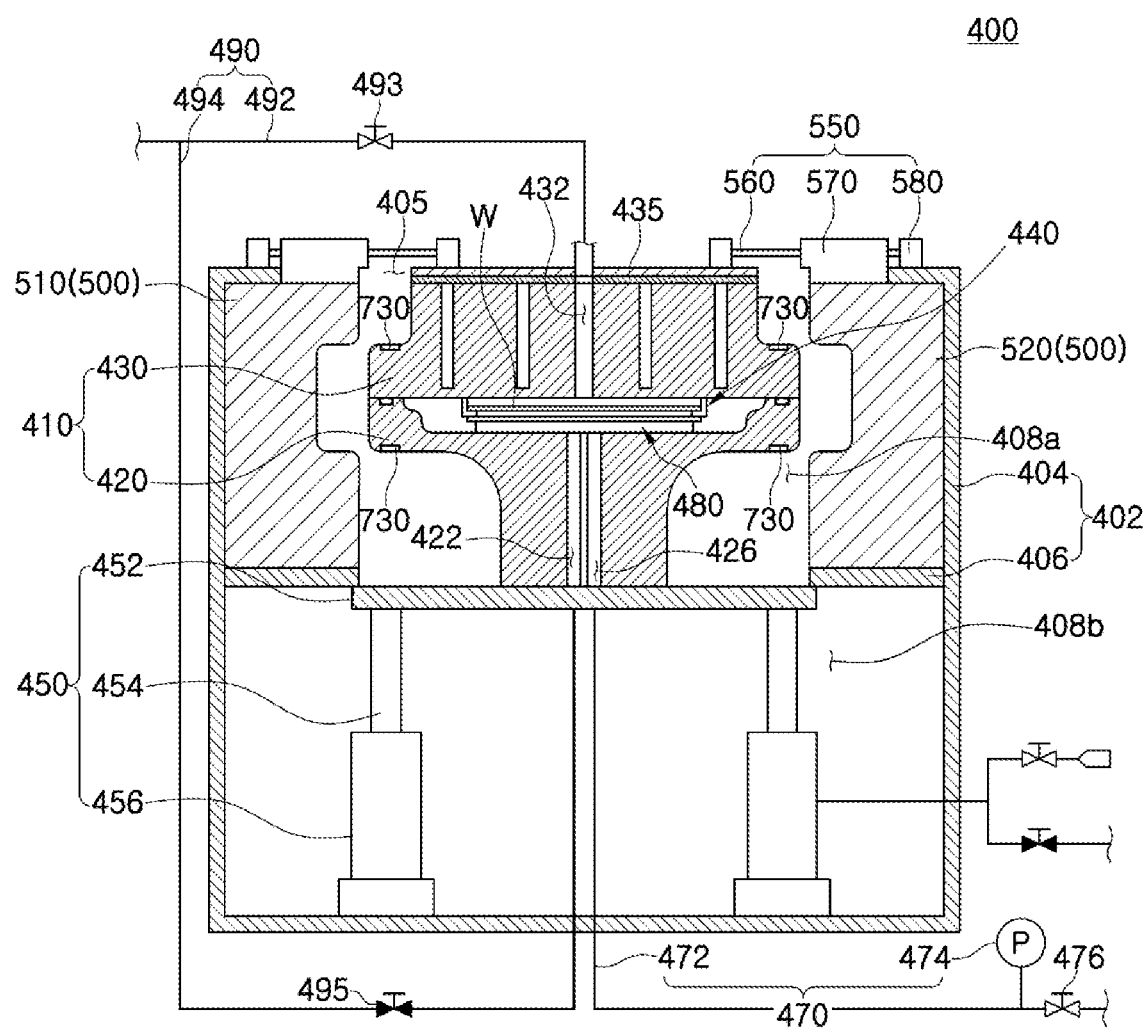
Figure 6:
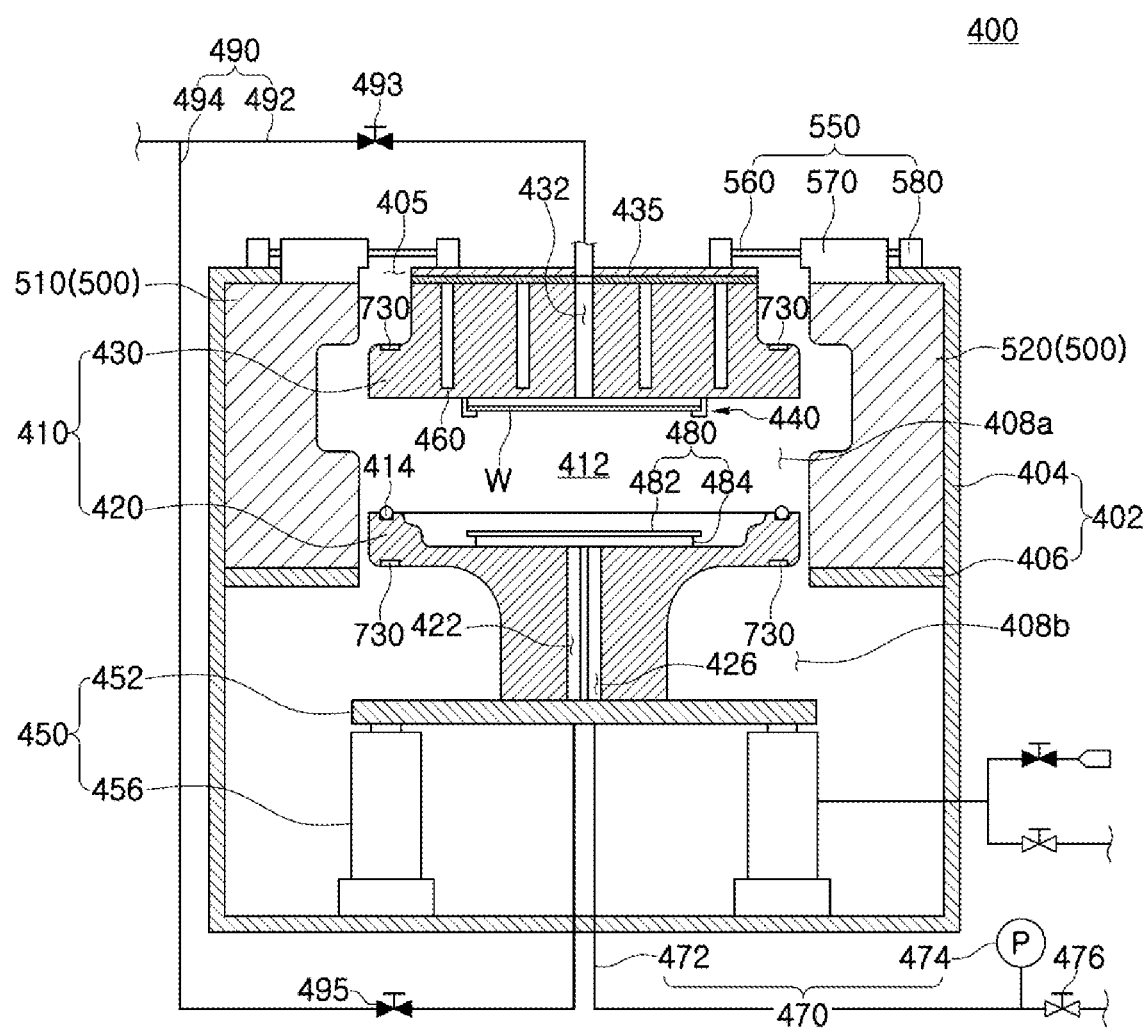

FIGS. 2 to 6 illustrate steps in which processing and discharging of the substrate W are performed after the substrate W is input to the substrate processing apparatus (the second process processing unit 280). As illustrated in FIG. 2, the second body 420 is lowered to the open position. In this state, the substrate W is input and placed on the substrate support unit 440. Thereafter, as illustrated in FIG. 3, as the second body 420 is lifted by the lifting member 450 to the closed position, the first body 430 and the second body 420 are brought into contact with each other to close the processing space 412. Thereafter, as illustrated in FIG. 4, the clamping member 500 clamps the first body 430 and the second body 420, the processing fluid is supplied to the processing space 412, and thermal energy is supplied to the processing space 412 by the heating member 460. When a predetermined level of pressure and a predetermined level of temperature are formed, a supercritical fluid is formed in the processing space 412, and a processing process using the supercritical fluid is performed. When the processing process using the supercritical fluid is completed, the clamping member 500 is moved to the release position as illustrated in FIG. 5. Then, as illustrated in FIG. 6, the second body 420 is lowered to the open position, and the substrate W is discharged to the outside.

As illustrated in FIGS. 2 to 6, the clamping member 500 is brought into contact with the first body 430 and the second body 420 as it is moved in a horizontal direction, causing the first body 430 and the second body 420 to be pressed into close contact with each other in a direction opposite to the pressure inside the processing space 412.

To maintain the inside of the processing space 412 in a supercritical state, the first body 430 and the second body 420 have to be clamped with a force larger than the pressure inside the processing space 412. At this time, friction may occur in the contact region between the first and second bodies 430 and 420 and the clamping member 500, resulting in particle generation. In particular, when the first body 430, the second body 420, and the clamping member 500 are made of metal, fatal metallic particles may be generated on the substrate W, causing process defects. To overcome this problem, a method of attaching a film or the like to the contact region between the first and second bodies 430 and 420 and the clamping member 500 may be considered. However, this approach is still problematic in that the film may be peeled off when the first body 430 and the second body 420 are moved, and there is a possibility of contamination caused by an adhesive used for the attachment of the film.

Therefore, in some embodiments, by mounting the anti-friction member 730 in the form of a pad in the groove formed in the contact region between the first and second bodies 430 and 420 and the clamping member 500, it is possible to reduce damage and particle generation, which may occur upon contact of the first body 430 and the second body 420 with the clamping member 500.

Compared to the case of attaching the film, the anti-friction member 730 in the form of a pad is less likely to cause damage to parts and defective attachment, and thus have a long lifespan. In addition, the anti-friction member 730 is advantageously repeatedly installed in the same position without requiring the provision of a separate assembly jig because the assembly position thereof has already been structurally determined.

Consequently, by the adoption of the anti-friction member 730 in the form of a pad, the cost and time for maintenance of the substrate processing apparatus 400 may be reduced, and thus the overall capacity utilization rate of the substrate processing apparatus 400 may be improved. Hereinafter, various embodiments of the substrate processing apparatus 400 to which the anti-friction member 730 is applied will be described.

Figure 7:
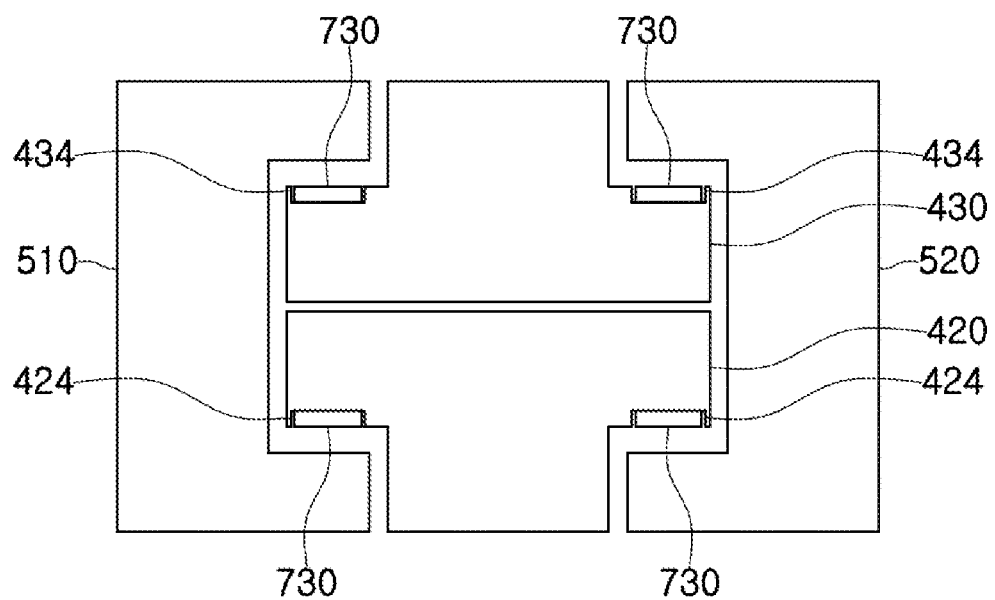
FIGS. 7 to 9 are views each schematically illustrating the structure of a substrate processing apparatus according to an embodiment of the present disclosure.
Figure 8:
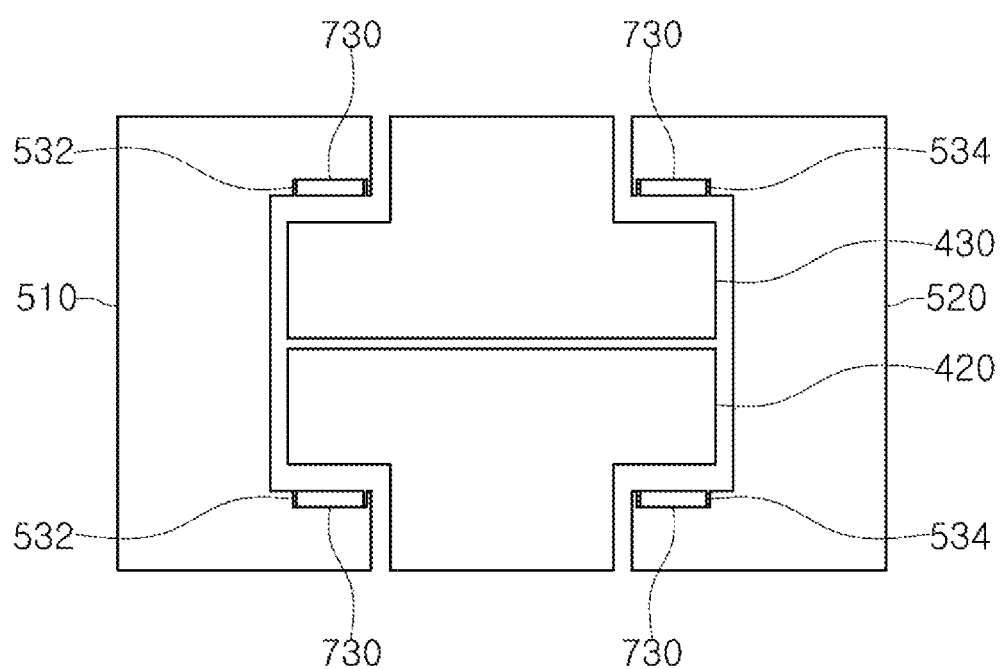
Figure 9:
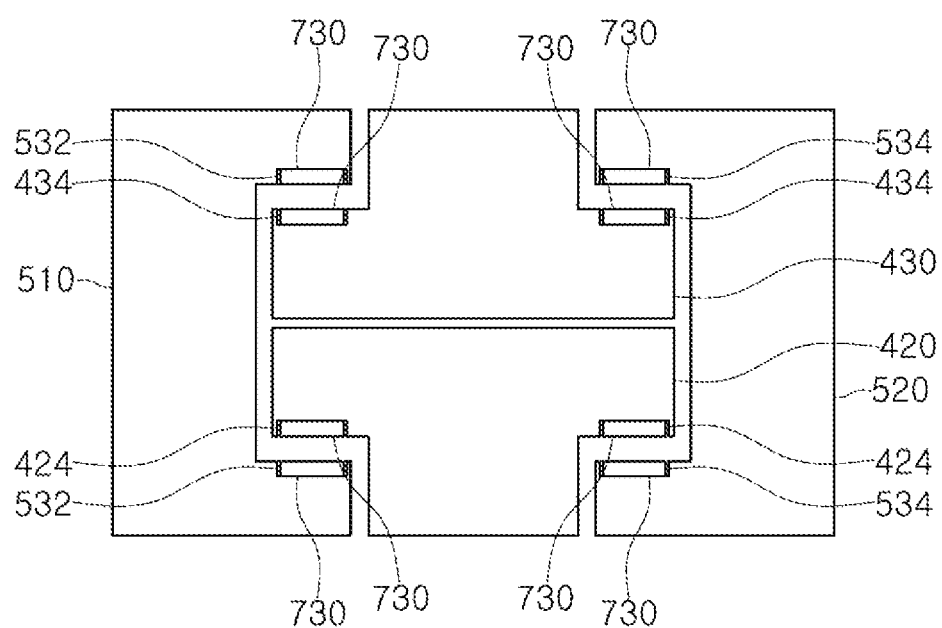

FIGS. 7 to 9 are views each schematically illustrating the structure of a substrate processing apparatus according to an embodiment of the present disclosure.

A substrate processing apparatus 400 according to an embodiment of the present disclosure includes: a process chamber 410 including a first body 430 and a second body 420 that are coupled to each other to form a processing space 412 therein; a clamping member 500 for clamping the first body 430 and the second body 420 to make close contact between the first body 430 and the second body 420; and an anti-friction member 730 mounted in a groove formed in a contact region between the first and second bodies 430 and 420 and the clamping member 500.

FIG. 7 illustrates a case where the first body 430 and the second body 420 have first and second body grooves 434 and 424, respectively, and the anti-friction member 730 is inserted into each of the first and second body grooves 434 and 424. According to an embodiment of the present disclosure, the groove in which the anti-friction member 730 is mounted may include the first body groove 434 formed in the first body 430 and the second body groove 424 formed in the second body 420.

FIG. 8 illustrates a case where the clamping member 500 has a first clamping groove 532 formed in a contact region between the clamping member 500 and the first body 430 and a second clamping groove 534 formed in a contact region between the clamping member 500 and the second body 420, and the anti-friction member 730 is inserted into each of the first clamping groove 532 and the second clamping groove 534. According to an embodiment of the present disclosure, the groove in which the anti-friction member 730 is mounted may include the first clamping groove 532 formed in the clamping member 500 in the contact region between the clamping member 500 and the first body 430 and the second clamping groove 534 formed in the clamping member 500 in the contact region between the clamping member 500 and the second body 420.

FIG. 9 illustrates a case where each of the first body 430, the second body 420, and the clamping member 500 has a groove, and the anti-friction member 730 is mounted in the groove. As illustrated in FIG. 9, the anti-friction member 730 may be inserted into each of the first body groove 434 of the first body 430, the second body groove 424 of the second body 420, and the first and second clamping grooves 532 and 534 of the clamping member 500.

According to an embodiment of the present disclosure, the anti-friction member 730 may be made of at least one of polyether ether ketone (PEEK), polyimide (PI), poly-aramid, polyethylene terephthalate (PET), zirconia, SiC, SiN, and alumina.

In addition, the anti-friction member 730 may be configured in the form of a metallic body having a surface treated with a resin coating or diamond-like coating (DLC).

Figure 10:
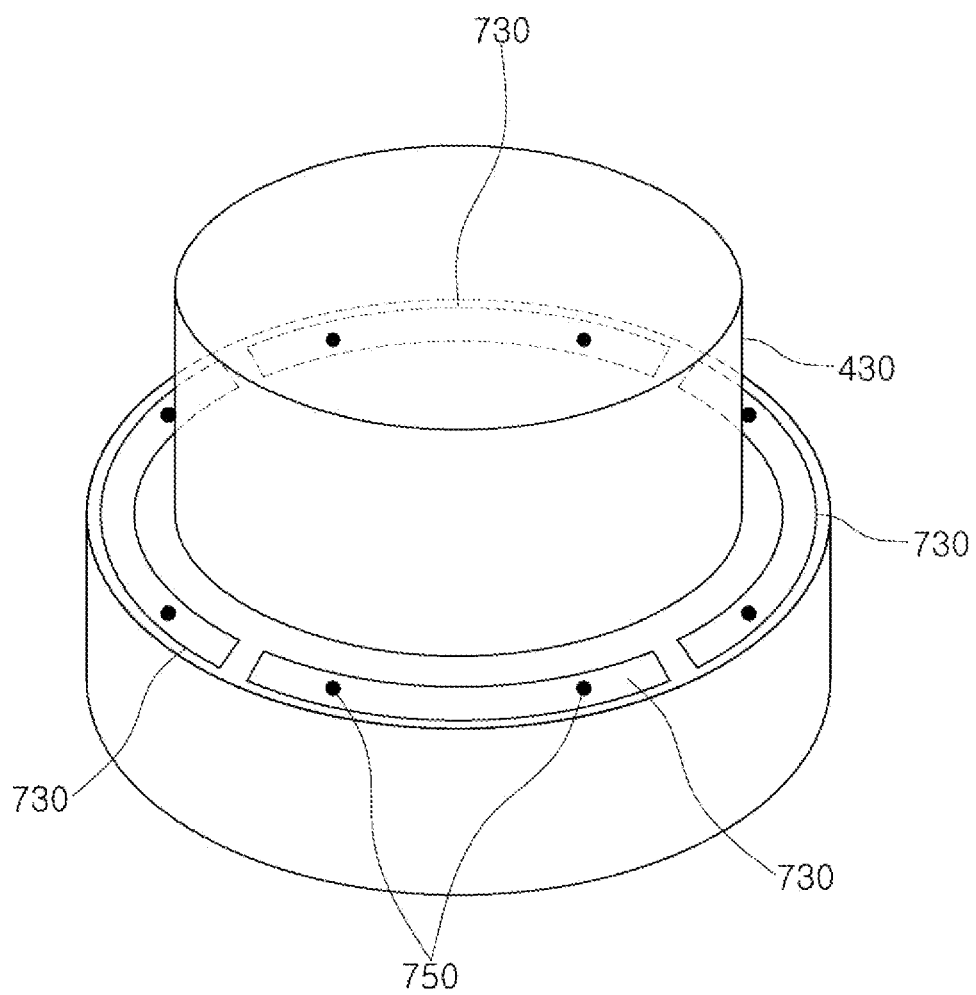
FIG. 10 is a view illustrating a body into which an anti-friction member is inserted in the substrate processing apparatus according to the embodiment of the present disclosure.

According to an embodiment of the present disclosure, the anti-friction member 730 may be composed of a plurality of anti-friction pads. For example, as illustrated in FIG. 10, the anti-friction member 730 mounted in the groove of the first body 430 may be composed of four anti-friction pads. When a single circular anti-friction pad is provided, the entire first body 430 has to be removed to replace the pad. However, when the plurality of anti-friction pads are provided as illustrated in FIG. 10, the anti-friction pads may be easily replaced without removing the first body 430.

On the other hand, the anti-friction member 730 may be composed of a single anti-friction pad, or may be composed of various number of anti-friction pads such as two, three, or four anti-friction pads.

Figure 11:
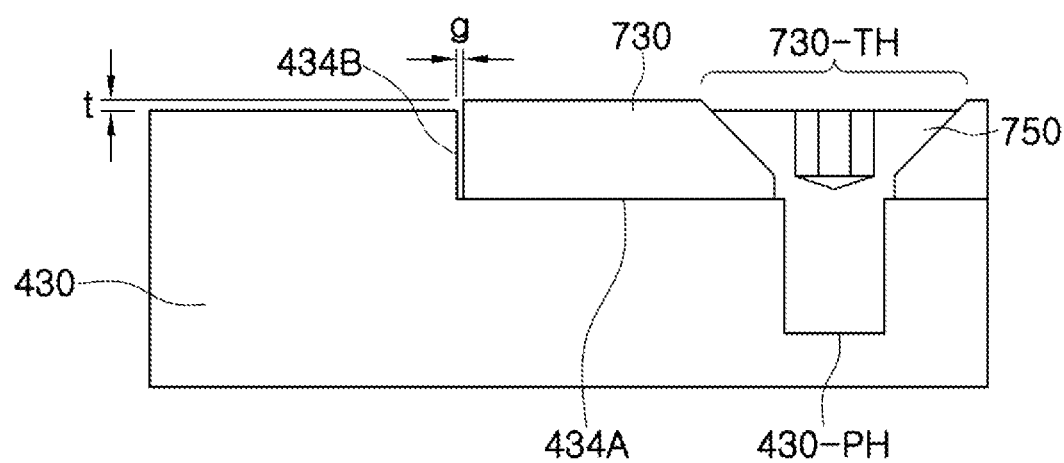
FIGS. 11 and 12 are sectional views illustrating the body into which the anti-friction member is inserted.
Figure 12:
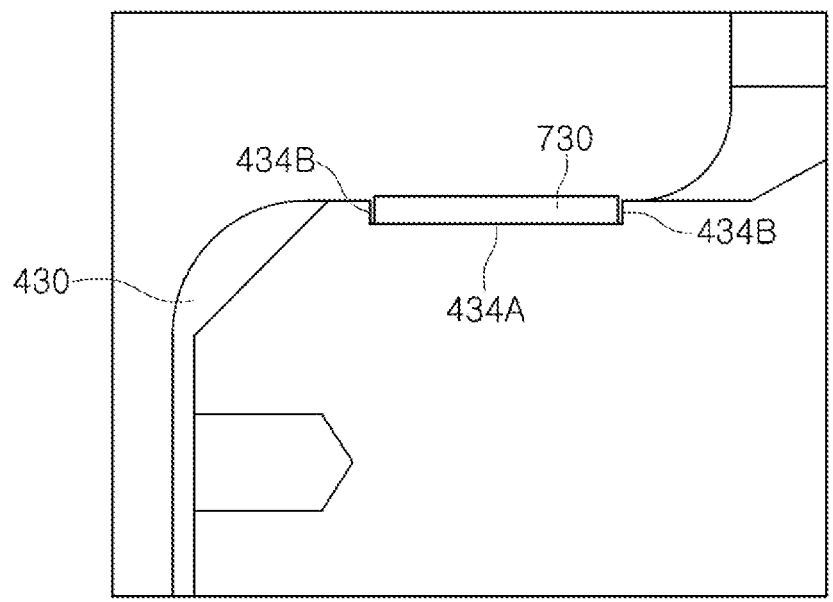

FIGS. 11 and 12 are sectional views illustrating the body into which the anti-friction member 730 is inserted.

According to an embodiment of the present disclosure, the anti-friction member 730 may have a through-hole 730-TH, and a fastening member 750 may be fastened to the contact region through the through-hole 730-TH, thereby fixing the anti-friction member 730. As illustrated in FIGS. 11 and 12, the anti-friction member 730 is inserted into the first body groove 434 formed in the first body 430, and the anti-friction member 730 is fixed to the first body 430 by the fastening member 750. In some embodiments, the anti-friction member 730 may have the through-hole 730-TH which is aligned with a closed-end hole 430-PH of the first body 430. The fastening member 750 may be inserted into the through-hole 730-TH of the anti-friction member 730 and the closed-end hole 430-PH of the first body 430 to fix the anti-friction member 730 at the contact region between the first body 430 and the clamping member 500. In some embodiments, the closed-end hole 430-PH may be famed at a bottom surface of 434A of the first body groove 434.

The present invention is not limited thereto. In some embodiments, the anti-friction member 730 may be fixed to the first body 430 by an adhesive applied to the bottom surface 434A of the first body groove 434.

According to an embodiment of the present disclosure, a predetermined gap g may be formed between the anti-friction member 730 and a side wall 434B of the first body groove 434. That is, the anti-friction member 730 may have a surface area smaller than a surface area of the first body groove 434. For example, the predetermined gap g between the anti-friction member 730 and the side wall 434B of the first body groove 434 may be set in consideration of a case where the contact region between the clamping member 500 and the first body 430 is subjected to pressure due to the pressure inside the processing space 412, and this pressure causes the anti-friction member 730 to deform. Therefore, the predetermined gap g may be set to be larger than the amount of deformation caused by the pressure acting on the anti-friction member 730.

In addition, the anti-friction member 730 may protrude farther than a peripheral portion of the first body groove 434. The anti-friction member 730 may be configured to protrude by a predetermined height t in consideration of a case where the anti-friction member 730 is deformed in the horizontal direction by pressure, so that the anti-friction member 730 performs an anti-friction function even upon deformation. In some embodiments, the anti-friction member 730 may protrude beyond an upper surface of the first body 430 so that an upper surface of the anti-friction member 730 is higher than the upper surface of the first body 430 by the height t.

The anti-friction member 730 as described above may be configured as a part of the substrate processing apparatus 400 illustrated in FIGS. 2 to 6. A substrate processing apparatus 400 according to an embodiment of the present disclosure includes: a process chamber 410 including a first body 430 and a second body 420 that are coupled to each other to form a processing space 412 therein; a fluid supplier including the upper supply port 432 and the lower supply port 422 for supplying a fluid to the processing space 412; a temperature controller (heating member 460) for controlling the temperature of the processing space 412; a clamping member 500 for clamping the first body 430 and the second body 420 to make close contact between the first body 430 and the second body 420; and an anti-friction member 730 mounted in a groove formed in a contact region between the first and second bodies 430 and 420 and the clamping member 500.

The substrate processing apparatus 400 including the anti-friction member 730 may be configured as a part of the substrate processing facility 1. For example, the substrate processing apparatus 400 may be included in the second process processing unit 280.

A substrate processing facility 1 according to an embodiment of the present disclosure includes a load port 120 for allowing a substrate W to be input and discharged therethrough, a substrate transfer unit including an index chamber 140 and a load lock chamber 220, a first process processing unit 260 for supplying a processing liquid to the substrate W; and a second process processing unit 280 for drying the processing liquid remaining on the substrate W.

The second process processing unit 280 includes: a process chamber 410 including a first body 430 and a second body 420 that are coupled to each other to form a processing space 412 therein; a fluid supplier including the upper supply port 432 and the lower supply port 422 for supplying a fluid to the processing space 412; a temperature controller (a heating member 460) for controlling the temperature of the processing space 412; a clamping member 500 for clamping the first body 430 and the second body 420 to make close contact between the first body 430 and the second body 420; and an anti-friction member 730 mounted in a groove formed in a contact region between the first and second bodies 430 and 420 and the clamping member 500.

As described above, a side wall 434B of a first body groove 434 and a side surface of the anti-friction member 730 may be configured not to be in contact with each other. For example, a predetermined gap g may be formed between the anti-friction member 730 and the side wall 434B of the first body groove 434 as illustrated in FIG. 11.

FIGS. 13 to 16 are views illustrating a substrate processing apparatus according to an embodiment of the present disclosure to which an anti-friction member is applied.

Figure 13:
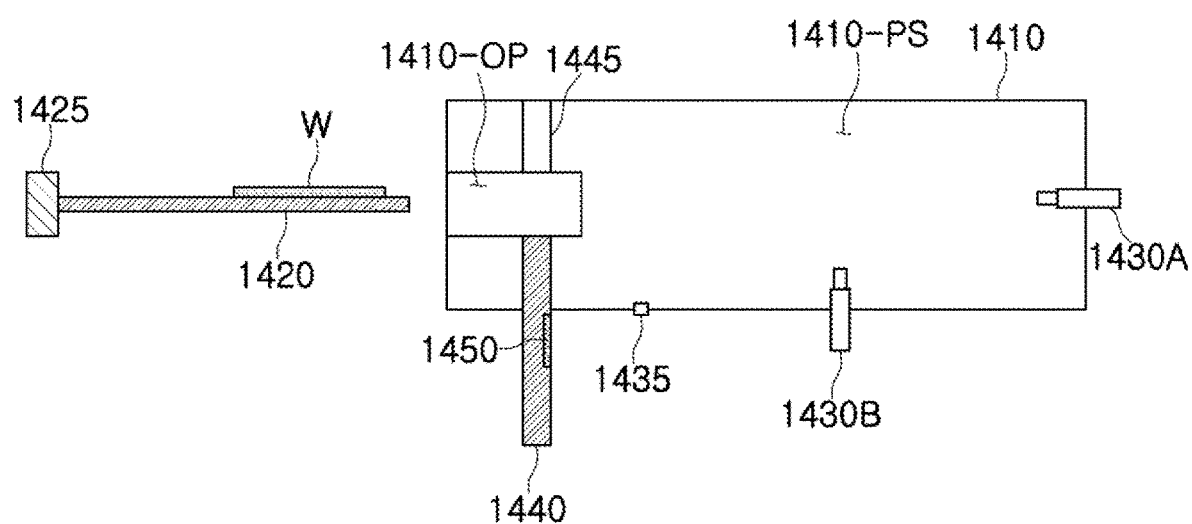
FIGS. 13 to 16 are views illustrating a substrate processing apparatus according to an embodiment of the present disclosure to which an anti-friction member is applied.
Figure 14:
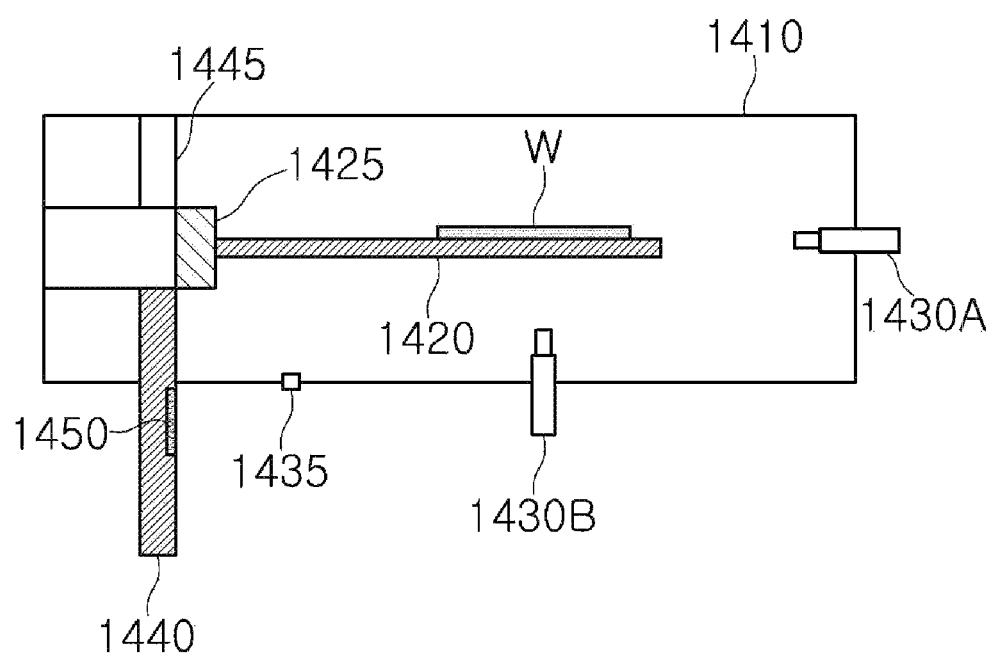

Referring to FIGS. 13 to 16, the substrate processing apparatus includes a first body 1410 having a chamber shape with an opening 1410-OP formed at a side thereof, and a second body 1425 provided in a shape corresponding to the opening 1410-OP and coupled to the opening 1410-OP to form a processing space 1410-PS for a substrate W. In some embodiments, the chamber shape of the first body 140 may define the processing space 1410-PS, and the opening 1410-OP may be formed at the side of the chamber shape. The opening 1410-OP may be connected to the processing space 1410-PS. The second body 1425 may be fitted into the opening 1410-OP of the first body 1410 to close the processing space 1410-PS. A substrate support unit 1420 for supporting the substrate W is installed on the second body 1425. The second body 1425 may be moved in a horizontal direction by a driving device and coupled to the first body 1410. In addition, the first body 1410 and the second body 1425 are coupled to each other to form the processing space therein, and a locking member 1440 for fixing the first body 1410 and the second body 1425 is provided. As illustrated in FIGS. 13 and 14, the substrate support unit 1420 for supporting the substrate W is moved horizontally and enters the first body 1410. Then, the first body 1410 and the second body 1425 are clamped as the locking member 1440 is lifted to locking slot 1445.

Figure 15:
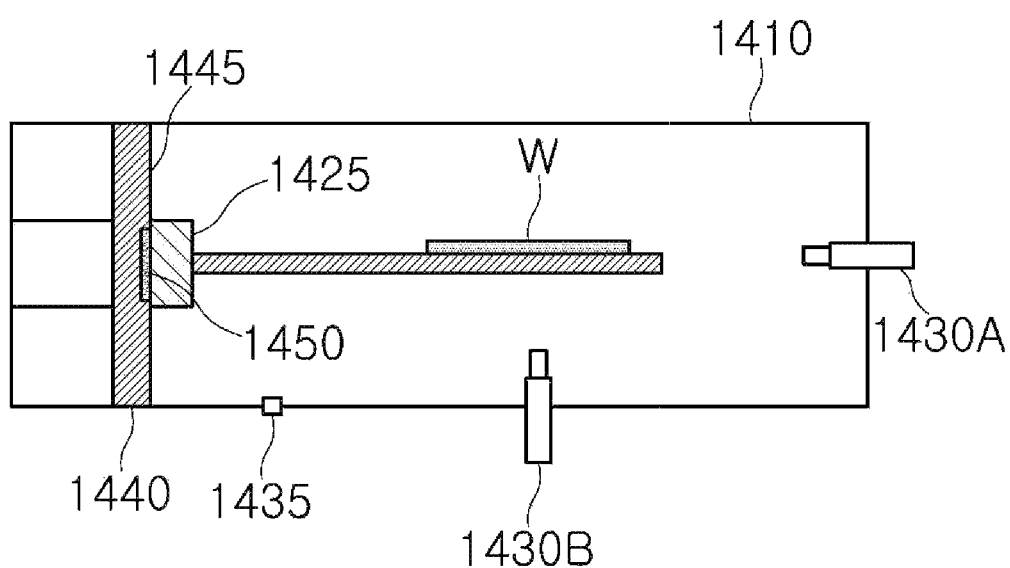

Thereafter, as illustrated in FIG. 15, a fluid is supplied to the processing space by a fluid supplier 1430A and 1430B in a closed state of the processing space, and thermal energy is applied to the processing space by a temperature controller to create a high-temperature and high-pressure environment. When the process processing is completed in the high-temperature and high-pressure environment, the fluid is discharged to the outside through a fluid outlet 1435. The locking member 1440 is then lowered from the locking slot 1445, and the substrate W is discharged to the outside.

According to an embodiment of the present disclosure, an anti-friction member 1450 may be provided in a contact region between the second body 1425 and the locking member 1440. As described above, the anti-friction member 1450 may be mounted in a groove formed in the contact region.

Figure 16:
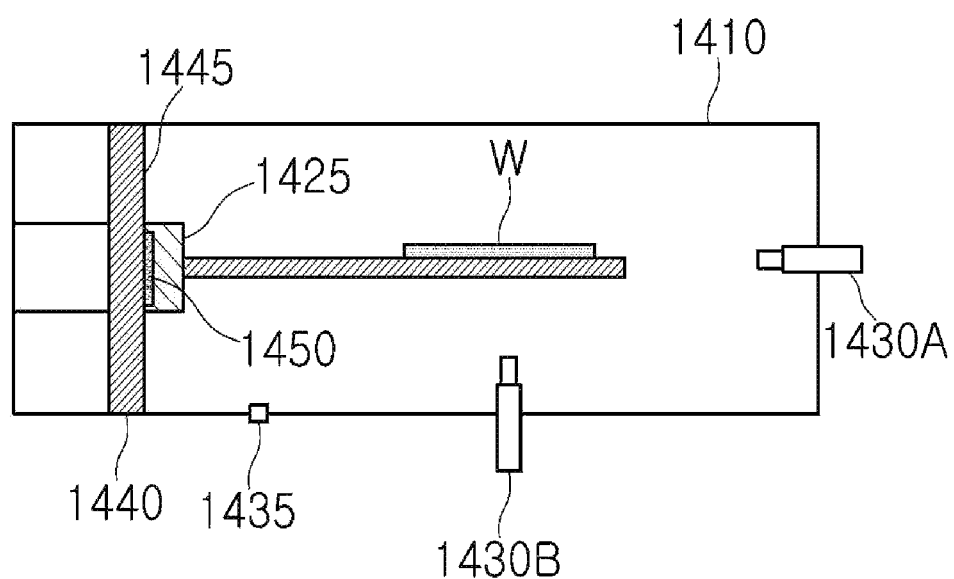

According to an embodiment of the present disclosure, as illustrated in FIG. 15, the anti-friction member 1450 may be mounted in a groove formed in a contact region of the locking member 1440. On the other hand, as illustrated in FIG. 16, the anti-friction member 1450 may be mounted in a groove famed in a contact region of the second body 1425.

According to an embodiment of the present disclosure, the anti-friction member 1450 may be made of at least one of polyether ether ketone (PEEK), polyimide (PI), polyaramid, polyethylene terephthalate (PET), zirconia, SiC, SiN, and alumina. In addition, the anti-friction member 1450 may be configured in the form of a metallic body having a surface treated with a resin coating or diamond-like coating (DLC).

According to an embodiment of the present disclosure, a predetermined gap g may be formed between the anti-friction member 1450 and a side wall of the groove. Here, the predetermined gap g may be set to be larger than the amount of deformation caused by the pressure acting on the anti-friction member 145. In addition, the anti-friction member 1450 may protrude farther than a peripheral portion of the groove.

According to an embodiment of the present disclosure, the anti-friction member 1450 may have a through-hole, and a fastening member may be fastened to the contact region (of the second body 1425 or the locking member 1440) through the through-hole, thereby fixing the anti-friction member 1450 to the second body 1425 or the locking member 1440 as shown in FIG. 11. For the simplicity of drawings, the through-hole and the fastening member are now shown in FIGS. 13-16.

FIGS. 17A to 19B are views illustrating a substrate processing apparatus according to an embodiment of the present disclosure to which an anti-friction member is applied. In the previous embodiments described with reference to FIGS. 2 to 10, the first body 430 and the second body 420 are clamped by the clamping member 500 so that the first body 430 and the second body 420 are not separated from each other. However, for a simpler configuration of facilities, the first body 430 and the second body 420 may be coupled to each other without requiring the provision of a clamping device, and the first body 430 and the second body 420 may not be separated from each other by the lifting member 450 (hydraulic pressure of a cylinder). In this case, as illustrated in FIGS. 17A to 19B, an anti-friction member 730 may be positioned in a contact region between a first body 430 and a second body 420.

Figure 17A:
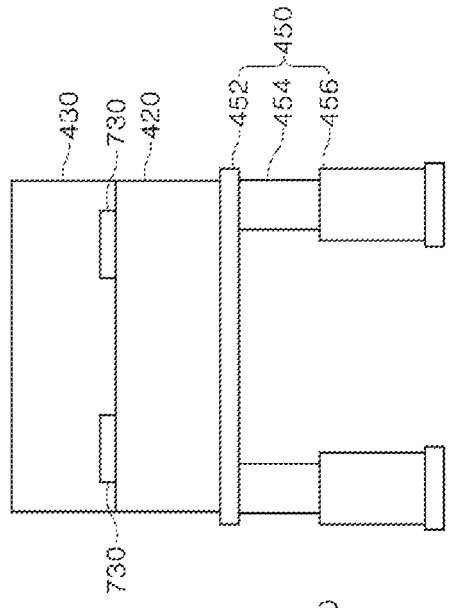
FIGS. 17A and 17B, 18A and 18B, and 19A and 19B are views illustrating a substrate processing apparatus according to an embodiment of the present disclosure to which an anti-friction member is applied.
Figure 17B:
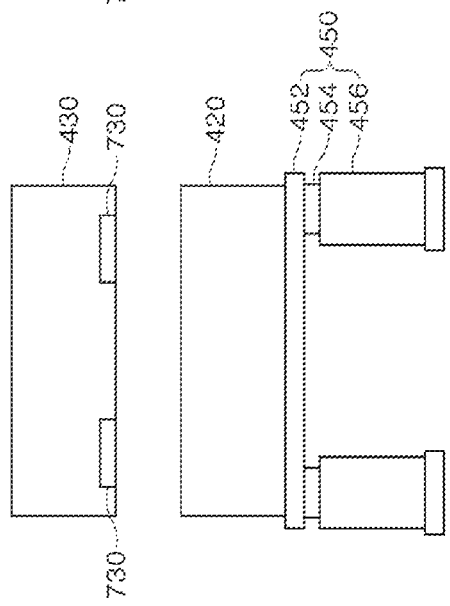
Figure 18A:
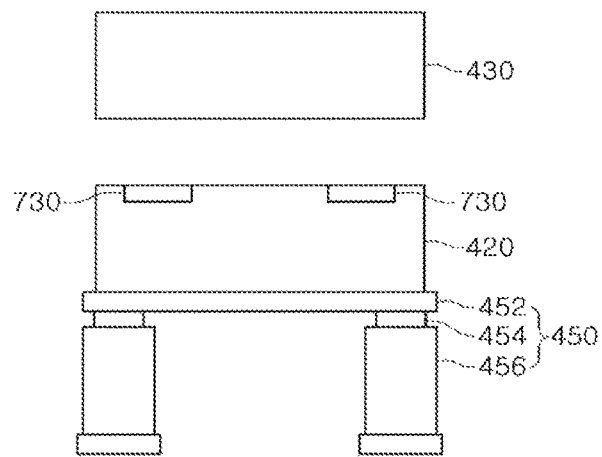
Figure 18B:
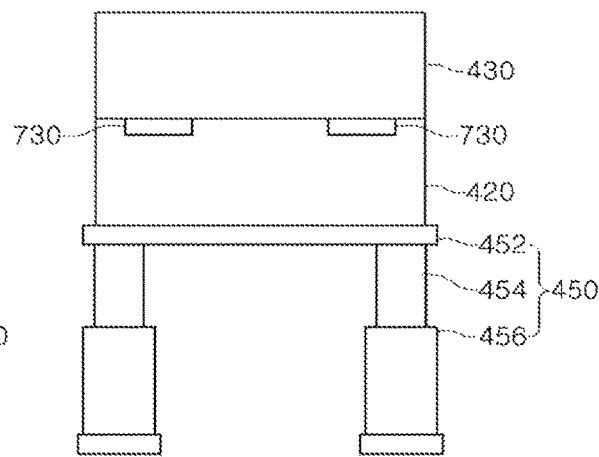
Figure 19A:
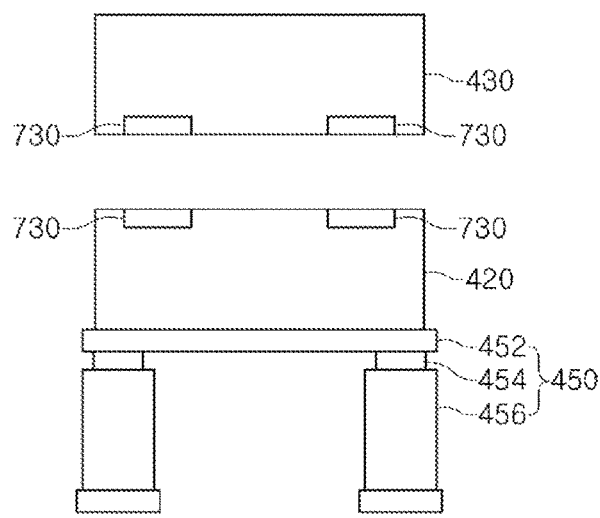
Figure 19B:
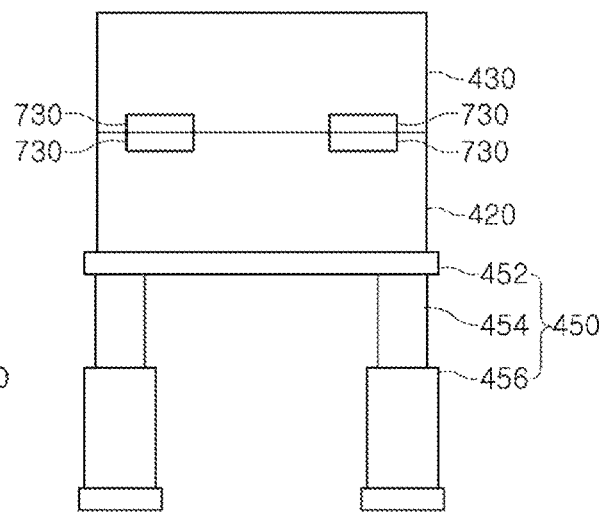

For example, as illustrated in FIGS. 17A and 17B, the anti-friction member 730 may be mounted in a groove formed in the first body 430 positioned in an upper position. On the other hand, as illustrated in FIGS. 18A and 18B, the anti-friction member 730 may be mounted in a groove formed in the second body 420 positioned in a lower position. On the other hand, as illustrated in FIGS. 19A and 19B, the anti-friction member 730 may be mounted in a groove formed in each of the first body 430 and the second body 420.

Figure 20:
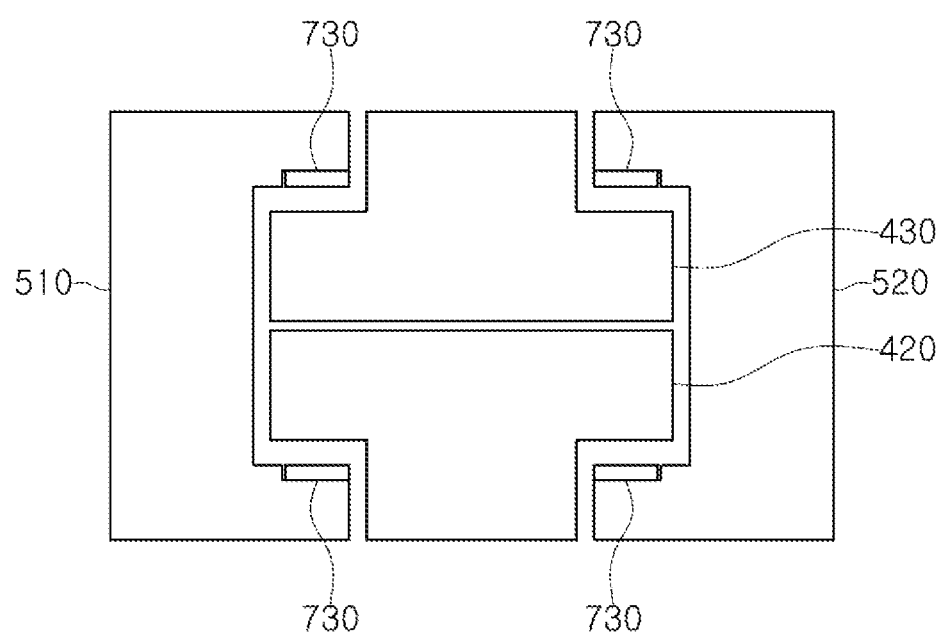
FIGS. 20 and 21 are views illustrating a substrate processing apparatus according to an embodiment of the present disclosure to which an anti-friction member is applied.
Figure 21:
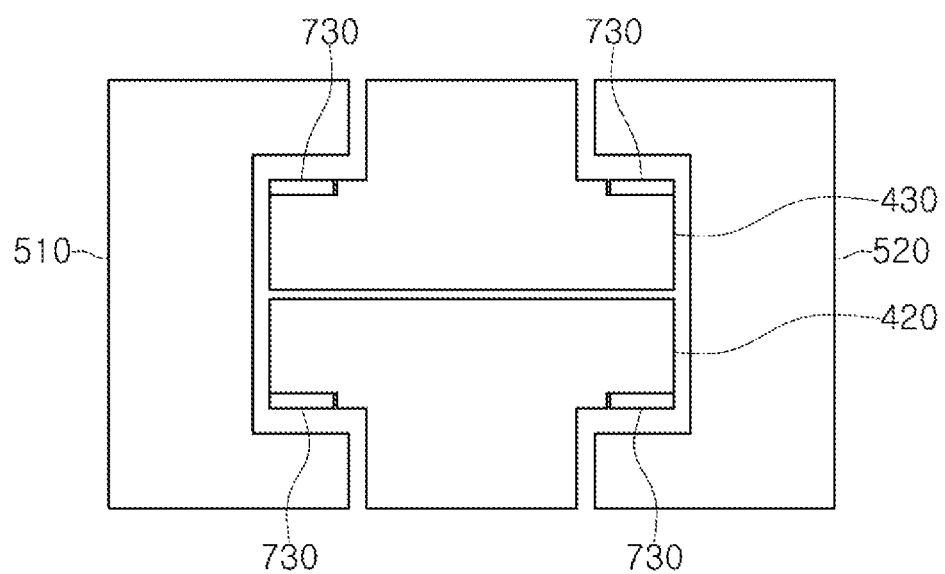

FIGS. 20 and 21 are views illustrating a substrate processing apparatus according to an embodiment of the present disclosure to which an anti-friction member is applied. Unlike the previous embodiments described with reference to FIGS. 7 to 12 in which the groove is formed in a central portion of the first body 430, the second body 420, or the clamping member 500 and the anti-friction member 730 is inserted into the groove of the central portion, a groove may be formed in a corner portion of the first body 430, the second body 420, or the clamping member 500 and the anti-friction member 730 may be inserted into the groove of the corner portion.

For example, as illustrated in FIG. 20, a groove may be formed in a corner portion of a clamping member 500 in a contact region between the clamping member 500 and each of a first body 430 and a second body 420, and an anti-friction member 730 may be mounted in the groove of the corner portion. On the other hand, as illustrated in FIG. 21, a groove may be formed in a corner portion of each of the first body 430 and the second body 420 in a contact region between each of the first body 430 and the second body 420 and the clamping member 500, and the anti-friction member 730 may be mounted in the groove of the corner portion.

According to the substrate processing apparatus, by the provision of the anti-friction member in the groove formed in the contact region between the first and second bodies and the clamping member, it is possible to reduce damage and particle generation caused by an impact generated upon contact therebetween.

It should be noted that the exemplary embodiments and the accompanying drawings are merely provided to thoroughly disclose a part of technical idea of the present disclosure, and modifications and specific embodiments which can be easily devised from the description of the above-mentioned embodiments by those skilled in the art to which the following description pertains will fall within the spirit and scope of the disclosure.

Accordingly, the present disclosure is intended to cover not only the exemplary embodiments, but also various alternatives, modifications, equivalents, and other embodiments that may be included within the spirit and scope of the present disclosure as defined by the appended claims.

What is claimed is:

1. A substrate processing apparatus comprising:
   a process chamber comprising a first body with a top surface, a side surface, and a first protrusion portion extending outwardly from the side surface and a second body with a second protrusion portion at an upper portion of the second body, wherein the first protrusion portion and the second protrusion portion are coupled with each other, and wherein a processing space is defined by the first body and the second body coupled with each other and a top surface of the first protrusion is connected to the side surface and is lower than the top surface of the first body;
   a clamping member configured to clamp the first protrusion portion of the first body and the second protrusion portion of the second body;
   an anti-friction member mounted in a groove formed at a contact region between the clamping member and at least one of the first body and the second body; and
   a fastening member disposed in the contact region and configured to fix the anti-friction member at the contact region.

2. The substrate processing apparatus of claim 1, wherein the groove comprises:
   a first body groove formed at the first body in a first contact region between the clamping member and the first body; and a second body groove formed at the second body in a second contact region between the clamping member and the second body.

3. The substrate processing apparatus of claim 1,
wherein the groove comprises:

a first clamping groove formed at the clamping member in a first contact region between the clamping member and the first body; and a second clamping groove formed at the clamping member in a second contact region between the clamping member and the second body.

4. The substrate processing apparatus of claim 1,
wherein the anti-friction member is made of at least one of polyether ether ketone (PEEK), polyimide (PI), poly-aramid, polyethylene terephthalate (PET), zirconia, SiC, SiN, and alumina.

5. The substrate processing apparatus of claim 1,
wherein the anti-friction member includes a metallic body and a resin coating or a diamond-like coating (DLC) on a surface of the metallic body.

6. The substrate processing apparatus of claim 1,
wherein the anti-friction member has a surface area smaller than a surface area of the groove.

7. The substrate processing apparatus of claim 6,
wherein the anti-friction member and a side wall of the groove are spaced apart from each other by a predetermined gap, and wherein the predetermined gap is larger than the amount of deformation of the anti-friction member caused by pressure acting on the anti-friction member.

8. The substrate processing apparatus of claim 1,
wherein an upper surface of the anti-friction member is higher than an upper surface of the first body.

9. The substrate processing apparatus of claim 1,
wherein the anti-friction member has a through-hole that is aligned with a closed-end hole of the at least one of the first body and the second body, and wherein the fastening member is disposed in the through-hole of the anti-friction member and the closed-end hole of the at least one of the first body and the second body to fix the anti-friction member at the contact region.

* * * * *